United States Patent [19]

Aipperspach et al.

[11] Patent Number: 6,060,909
[45] Date of Patent: May 9, 2000

[54] COMPOUND DOMINO LOGIC CIRCUIT INCLUDING AN OUTPUT DRIVER SECTION WITH A LATCH

[75] Inventors: Anthony Gus Aipperspach; Gregory John Uhlmann, both of Rochester, Minn.

[73] Assignee: International Business Machines Corporation, Armonk, N.Y.

[21] Appl. No.: 09/063,534

[22] Filed: Apr. 21, 1998

[51] Int. Cl.[7] .................................................. H03K 19/096
[52] U.S. Cl. ............................................. 326/98; 326/121
[58] Field of Search ................................. 326/93, 95, 97, 326/98, 112, 119, 121, 56–58

[56] References Cited

U.S. PATENT DOCUMENTS

| | | | |
|---|---|---|---|
| 4,700,086 | 10/1987 | Ling et al. ............................... | 326/121 |
| 5,015,882 | 5/1991 | Houston et al. . | |
| 5,208,489 | 5/1993 | Houston . | |
| 5,712,826 | 1/1998 | Wong et al. ............................. | 326/95 |
| 5,757,205 | 5/1998 | Ciraula et al. .......................... | 326/95 |
| 5,841,304 | 11/1998 | Tam ........................................ | 327/161 |
| 5,852,373 | 12/1998 | Chu et al. ................................ | 326/98 |
| 5,933,038 | 8/1999 | Klass ...................................... | 326/98 |

*Primary Examiner*—Jon Santamauro
*Assistant Examiner*—Don Phu Le
*Attorney, Agent, or Firm*—Joan Pennington

[57] ABSTRACT

An improved compound domino logic circuit is provided. The compound domino logic circuit includes a dynamic logic section and an output driver section. The dynamic logic section includes a clock source providing a clock signal defining an evaluate mode during each high clock cycle and a precharge mode during each low clock cycle. The dynamic logic section includes at least two input nodes for receiving at least two input signals during each evaluate mode. The dynamic logic section includes an output driver input node providing an dynamic output signal during each evaluate mode. The output driver section receives the dynamic output signal and provides an output signal. The output driver section includes a latch for maintaining the output signal during a next precharge mode of the dynamic logic section. A clocked field effect transistor coupled to the output driver input node isolates the dynamic logic section from the output driver section. The output driver section includes a first inverter and a second inverter connected in series to provide the output signal at the output of the second inverter. The output driver section latch is provided by a tristate feedback device connected across the first inverter. The tristate feedback device is enabled only during the precharge mode of the dynamic logic section.

13 Claims, 1 Drawing Sheet

COMPOUND DOMINO LOGIC CIRCUIT INCLUDING AN OUTPUT DRIVER SECTION WITH A LATCH

FIELD OF THE INVENTION

The present invention relates compound domino logic circuits, and more particularly to, an improved compound domino logic circuit.

DESCRIPTION OF THE RELATED ART

Complementary metal oxide semiconductor (CMOS) compound domino logic (CDL) circuits are known. CMOS CDL circuits provide a logical function, such as a NOR function or a NAND function. Typically the CMOS CDL circuits provide a logical output signal responsive to a plurality of input signals. Many CDL circuits include a P-channel field effect transistor that is clocked to precharge an output node to a predetermined logic state. With the logic NAND function, when all the input devices are driven by a logic high level, the output node will be a logic low. Alternatively, when any of the input devices are driven by a logic low level, the output node will remain at the precharged logic high.

U.S. Pat. Nos. 5,015,882 and 5,208,489 disclose various arrangements of CMOS compound domino logic circuits.

A compound domino logic circuit is needed to condense two dynamic read nodes into an output driver while maintaining a last output state during a next precharge mode.

SUMMARY OF THE INVENTION

A principal object of the present invention is to provide an improved compound domino logic circuit. Other objects are to provide such compound domino logic circuit substantially without negative effects and that overcome some of the disadvantages of prior art arrangements.

In brief, an improved compound domino logic circuit is provided. The compound domino logic circuit includes a dynamic logic section and an output driver section. The dynamic logic section includes a clock source providing a clock signal defining an evaluate mode during each high clock cycle and a precharge mode during each low clock cycle. The dynamic logic section includes at least two input nodes for receiving at least two input signals during each evaluate mode. The dynamic logic section includes an output driver input node providing an dynamic output signal during each evaluate mode. The output driver section receives the dynamic output signal and provides an output signal. The output driver section includes a latch for maintaining the output signal during a next precharge mode of the dynamic logic section.

In accordance with features of the invention, a clocked field effect transistor coupled to the output driver input node isolates the dynamic logic section from the output driver section. The output driver section includes a first inverter and a second inverter connected in series to provide the output signal at the output of the second inverter. The output driver section latch is provided by a tristate feedback device connected across the first inverter. The tristate feedback device is enabled only during the precharge mode of the dynamic logic section.

BRIEF DESCRIPTION OF THE DRAWING

The present invention together with the above and other objects and advantages may best be understood from the following detailed description of the preferred embodiments of the invention illustrated in the drawing, wherein.

DETAILED DESCRIPTION OF THE PREFERRED EMBODIMENTS

Figure 1:
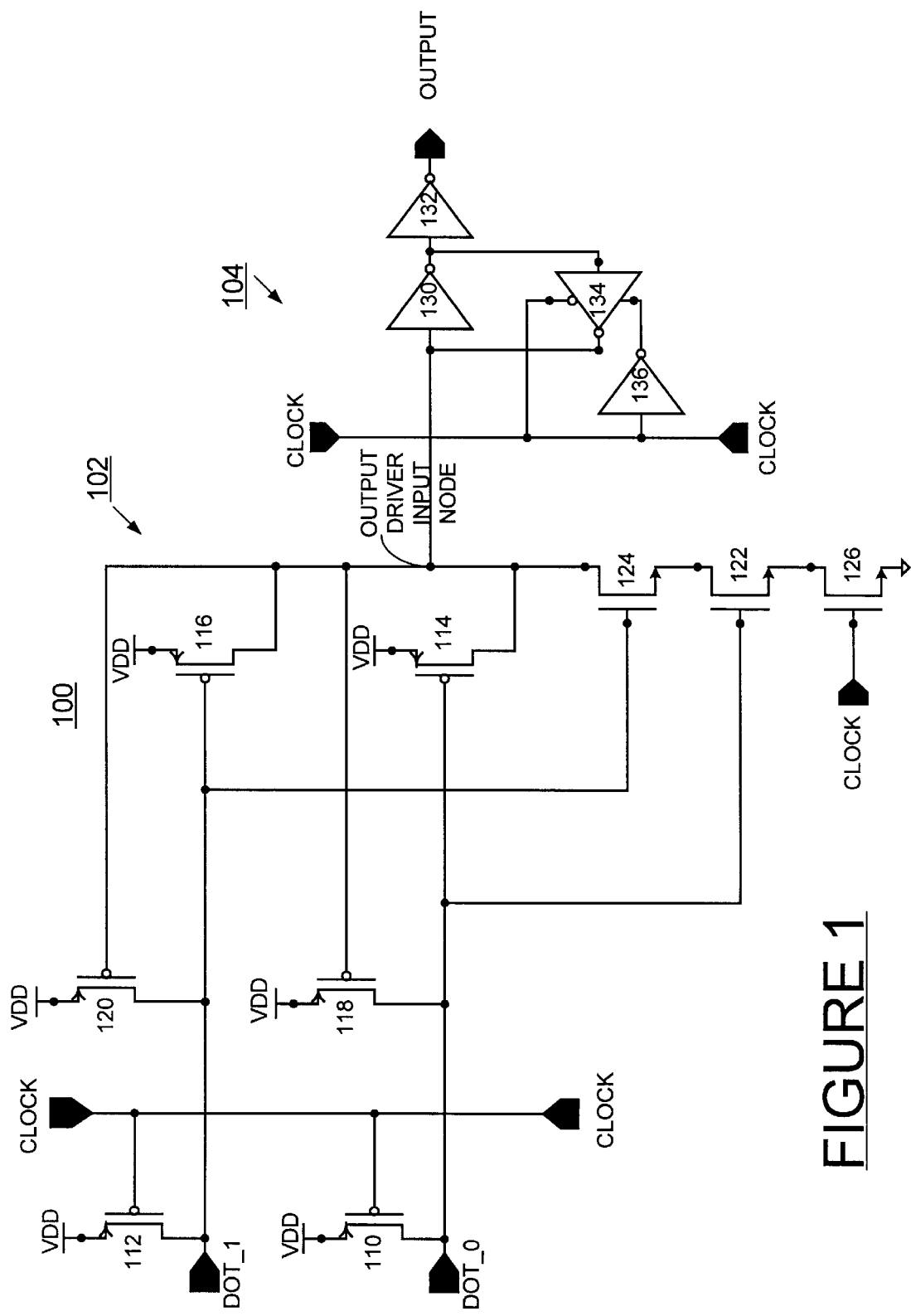
FIG. 1 is a schematic diagram representation of a compound domino logic (CDL) circuit in accordance with the present invention.

Having reference now to the drawing, FIG. 1 illustrates a compound domino logic (CDL) circuit generally designated by the reference character 100 in accordance with the present invention. The compound domino logic circuit 100 includes a dynamic logic section 102 and an output driver section 104. The compound domino logic circuit 100 receives two input signals at a pair of nodes DOT_0 and DOT_1 within the dynamic logic section 102. The compound domino logic circuit 100 provides an output signal at a node OUTPUT in the output driver section 104. The compound domino logic circuit 100 has a precharge mode during low clock cycles and an evaluate mode during high clock cycles.

In accordance with features of the invention, compound domino logic CDL circuit 100 condenses two dynamic read nodes into the output driver 104 while maintaining the last output state during the precharge mode. CDL dynamic logic section 102 includes a pair of clocked, precharge P-channel field effect transistors (FET) 110 and 112 respectively coupled between a supply voltage VDD and a respective one of two input nodes DOT_0, DOT_1. A gate of the PFETs 110, 112 receives a clock signal CLOCK. The source of the precharge PFETs 110, 112 is connected to the positive supply rail VDD. The drain of the respective PFETs 110, 112 is connected to the input nodes DOT_0 and DOT_1. The precharge PFETs 110, 112 are turned on with low clock cycles to precharge the two input nodes DOT_0, DOT_1 to a high or one level during the precharge mode. The precharge PFETs 110, 112 are turned off with high clock cycles during the evaluate mode.

CDL dynamic logic section 102 includes a pair of input signal gated PFETs 114 and 116 connected between the supply voltage and an input node to the output driver 104 at a node labeled OUTPUT DRIVER INPUT NODE. A gate of the PFETs 114 and 116 receives a respective input signal DOT_0, DOT_1. The source of the PFETs 114, 116 is connected to the positive supply rail VDD. The drain of each PFETs 110, 112 is connected to an output node labeled OUTPUT DRIVER INPUT. The input signal gated PFETs 114, 116 are turned on by low input signals at nodes DOT_0, DOT_1 during the evaluate mode. The input signal gated PFETs 114, 116 are turned off by high input signals at nodes DOT_0, DOT_1 during the evaluate mode.

CDL dynamic logic section 102 includes a third pair of keeper PFETs 118, 120, each having its source connected to the supply voltage VDD and its drain connected to a respective of two input sources DOT_0, DOT_1. The gate of PFETs 118, 120 is connected to the OUTPUT DRIVER INPUT NODE. The keeper PFETs 118, 120 provide noise immunity, are turned on with a low gate input at the OUTPUT DRIVER INPUT NODE and function to hold the nodes DOT_0, DOT_1 at the precharged high level during the precharge mode.

CDL dynamic logic section 102 includes a stack of N-channel FETs 122, 124, and 126 connected in series between the OUTPUT DRIVER INPUT node and ground potential. A gate of NFET 122 is connected to the input source DOT_0. A gate of NFET 124 is connected to the input source DOT_1. The drain of NFET 124 is connected to the OUTPUT DRIVER INPUT node. The source of NFET 124 is connected to the drain of NFET 122. The source of NFET 122 is connected to the drain of the NFET 126. A gate of NFET 126 is connected to the clock signal input. The source of the clocked NFET 126 is connected to ground. The input signal gated NFETs 122, 124 are turned off by low input signals at nodes DOT_0, DOT_1 during the evaluate mode. The input signal gated NFETs 114, 116 are turned on by high input signals at nodes DOT_0, DOT_1 during the evaluate mode. The NFETs 114, 116 are turned on by the high level at nodes DOT_0, DOT_1 during the precharge mode. The NFET 126 is turned on during the evaluate mode by the high clock gate signal and is turned off during the precharge mode by the low clock gate signal.

In operation the dynamic logic section provides a NAND function. During the evaluate mode or high clock signal, with one or both low input signals applied to DOT_0, DOT_1, a logic high or one is provided at the OUTPUT DRIVER INPUT NODE. During the evaluate mode or high clock signal, with both high input signals applied to DOT_0, DOT_1, a logic low or zero is provided at the OUTPUT DRIVER INPUT NODE.

The output driver 104 includes a pair of series connected inverters 130 and 132. A tristate feedback device 134 is connected across the first inverter 130. The data input of the tristate feedback device 134 is connected to the output of the first inverter 130. The data output of the tristate feedback device 134 is connected to the input of the first inverter 130. The clock signal is applied to a first enable input of the tristate feedback device 134. An inverted clock signal is applied to a second enable input of the tristate feedback device 134 via an inverter 136. The tristate feedback device 134 functions as a latch holding the state at the OUTPUT DRIVER INPUT NODE during the precharge mode and being disabled during the evaluate mode. A tristate driver can be used for the tristate feedback device 134.

By providing the clocked NFET 126 in the stack with NFETs 122 and 124, the dynamic logic section 102 of circuit 100 is isolated from the output driver section 104. This enables the use of the tristate feedback device 134 around the first inverter 130 of the output driver 104. During the precharging mode, the tristate latch 134 is enabled so that the last output state at the OUTPUT DRIVER INPUT NODE is maintained while the CDL dynamic logic NAND section 102 is precharging. During the evaluate mode, the tristate device 134 is disabled or off and does not impede the output state at the OUTPUT DRIVER INPUT NODE. By using the tristate feedback device 134, fewer inverters are required in the output driver.

While the present invention has been described with reference to the details of the embodiments of the invention shown in the drawing, these details are not intended to limit the scope of the invention as claimed in the appended claims.

What is claimed is:

1. A compound domino logic circuit for providing a logical output based upon at least two input signals comprising:

a dynamic logic section including a clock source providing a clock signal defining an evaluate mode during each high clock cycle and a precharge mode during each low clock cycle, said dynamic logic section including at least two input nodes for receiving at least two input signals during each said evaluate mode, said dynamic logic section including an output driver input node for providing an dynamic output signal during each said evaluate mode, said dynamic logic section including a clocked field effect transistor coupled to said output driver input node for isolating said dynamic logic section from an output driver section, and said output driver section receiving said dynamic output signal and providing said logical output signal, said output driver section including a first inverter having an input connected to said output driver input node and a second inverter connected in series with said first inverter; said second inverter having an input connected to an output of said first inverter and having an output providing said logical output signal; and said output driver section including a latch for maintaining said output signal during a next precharge mode of said dynamic logic section;

wherein said output driver section latch is provided by a tristate feedback device connected across said first inverter, an input of said tristate feedback device connected to said output of said first inverter and an output of said tristate feedback device connected to said input of said first inverter.

2. A compound domino logic circuit for providing a logical output based upon at least two input signals as recited in claim 1 wherein said output driver section includes said clock source providing said clock signal defining said evaluate mode during each high clock cycle and said precharge mode during each low clock cycle and wherein said tristate feedback device is enabled only during the precharge mode of the dynamic logic section.

3. A compound domino logic circuit for providing a logical output based upon at least two input signals as recited in claim 2 wherein said tristate feedback device includes two enable inputs, one of said enable inputs receiving said clock signal and one of said enable inputs receiving an inverted clock signal.

4. A compound domino logic circuit comprising:

a dynamic logic section including a clock source providing a clock signal defining an evaluate mode during each high clock cycle and a precharge mode during each low clock cycle, said dynamic logic section including at least two input nodes for receiving at least two input signals during each said evaluate mode, said dynamic logic section including an output driver input node for providing an dynamic output signal during each said evaluate mode, and an output driver section receiving said dynamic output signal and providing an output signal, said output driver section including a latch for maintaining said output signal during a next precharge mode of said dynamic logic section; wherein said output driver section includes a first inverter having an input connected to said output driver input node and a second inverter connected in series with said first inverter; said second inverter having an input connected to an output of said first inverter and having an output providing said output signal;

wherein said output driver section latch is provided by a tristate feedback device connected across said first inverter, an input of said tristate feedback device connected to said output of said first inverter and an output of said tristate feedback device connected to said input of said first inverter.

5. A compound domino logic circuit as recited in claim 4 wherein said tristate feedback device is enabled only during the precharge mode of the dynamic logic section.

6. A compound domino logic circuit comprising:

a dynamic logic section including a clock source providing a clock signal defining an evaluate mode during each high clock cycle and a precharge mode during each low clock cycle, said dynamic logic section including at least two input nodes for receiving at least two input signals during each said evaluate mode, said dynamic logic section including an output driver input node for providing an dynamic output signal during each said evaluate mode, and an output driver section receiving said dynamic output signal and providing an output signal, said output driver section including a latch for maintaining said output signal during a next precharge mode of said dynamic logic section;

wherein said dynamic logic section includes a clocked field effect transistor coupled to said output driver input node for isolating said dynamic logic section from said output driver section; and wherein said latch includes a tristate feedback device, said tristate feedback device having enable inputs receiving said clock signal and an inverted clock signal.

7. A compound domino logic circuit as recited in claim 6 wherein said tristate feedback device is enabled only during each said precharge mode.

8. A compound domino logic circuit comprising:

a dynamic logic section including a clock source providing a clock signal defining an evaluate mode during each high clock cycle and a precharge mode during each low clock cycle, said dynamic logic section including at least two input nodes for receiving at least two input signals during each said evaluate mode, said dynamic logic section including an output driver input node for providing an dynamic output signal during each said evaluate mode, and an output driver section receiving said dynamic output signal and providing an output signal, said output driver section including a latch for maintaining said output signal during a next precharge mode of said dynamic logic section;

wherein said dynamic logic section includes at least two precharge field effect transistors for precharging said input nodes to a predetermined logic state; and wherein said at least two precharge field effect transistors for precharging said input nodes to said predetermined logic state are P-channel field effect transistors, each including a source connected to a positive voltage supply and a drain coupled to a respective one of said input nodes.

9. A compound domino logic circuit as recited in claim 8 wherein each of said at least two precharge field effect transistors for precharging said input nodes to said predetermined logic state include a gate connected to said clock source.

10. A compound domino logic circuit comprising:

a dynamic logic section including a clock source providing a clock signal defining an evaluate mode during each high clock cycle and a precharge mode during each low clock cycle, said dynamic logic section including at least two input nodes for receiving at least two input signals during each said evaluate mode, said dynamic logic section including an output driver input node for providing an dynamic output signal during each said evaluate mode, and an output driver section receiving said dynamic output signal and providing an output signal, said output driver section including a latch for maintaining said output signal during a next precharge mode of said dynamic logic section;

wherein said dynamic logic section provides a NAND logic function and includes at least two P-channel field effect transistors, each having a gate connected to a respective one of said input nodes; and wherein each of said at least two P-channel field effect transistors including a source connected to a positive voltage supply and a drain connected to said output driver input node.

11. A compound domino logic circuit as recited in claim 10 wherein said dynamic logic section includes at least two N-channel field effect transistors, each having a gate connected to a respective one of said input nodes.

12. A compound domino logic circuit as recited in claim 11 wherein said at least two N-channel field effect transistors are connected in series; a drain of a first transistor of said at least two series connected N-channel field effect transistors connected to said output driver input node and a source of said first transistor connected to a drain of a second transistor of said at least two series connected N-channel field effect transistors.

13. A compound domino logic circuit as recited in claim 12 wherein a source of a last transistor of said at least two series connected N-channel field effect transistors is connected to a drain of said clocked field effect transistor and a source of said clocked field effect transistor is connected to ground potential.

* * * * *